(12) United States Patent
Tihanyi

(10) Patent No.: US 7,294,885 B2
(45) Date of Patent: Nov. 13, 2007

(54) REVERSE BLOCKING SEMICONDUCTOR COMPONENT WITH CHARGE COMPENSATION

(75) Inventor: Jenö Tihanyi, deceased, late of Kirchheim (DE); by Nada Tihanyi, legal representative, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/096,716

(22) Filed: Mar. 31, 2005

(65) Prior Publication Data
US 2006/0175662 A1    Aug. 10, 2006

(30) Foreign Application Priority Data
Mar. 31, 2004   (DE) ............... 10 2004 015 921

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .............. 257/341; 257/328; 257/329; 257/340

(58) Field of Classification Search ........ 257/328–329, 257/339–340, 341, 335
See application file for complete search history.

(56) References Cited

U.S. PATENT DOCUMENTS

| | | | |
|---|---|---|---|
| 5,438,215 A | 8/1995 | Tihanyi | |
| 6,271,562 B1 | 8/2001 | Deboy et al. | |
| 6,468,847 B1 | 10/2002 | Disney | |
| 6,686,625 B2 | 2/2004 | Tihanyi | |
| 6,844,592 B2* | 1/2005 | Yamaguchi et al. | 257/341 |
| 6,861,706 B2 | 3/2005 | Tihanyi | |
| 6,888,195 B2* | 5/2005 | Saito et al. | 257/328 |
| 2001/0041400 A1 | 11/2001 | Ren et al. | |
| 2002/0040994 A1* | 4/2002 | Nitta et al. | 257/328 |
| 2002/0093049 A1 | 7/2002 | Tihanyi | |
| 2002/0185705 A1* | 12/2002 | Saitoh et al. | 257/492 |
| 2003/0181010 A1 | 9/2003 | Blanchard | |
| 2003/0230767 A1 | 12/2003 | Tihanyi | |
| 2004/0206989 A1* | 10/2004 | Aida et al. | 257/263 |

FOREIGN PATENT DOCUMENTS

| | | |
|---|---|---|
| DE | 43 09 764 C2 | 1/1997 |
| DE | 100 60 428 A1 | 6/2002 |
| DE | 102 26 664 A1 | 1/2004 |
| EP | 0 606 661 | 7/1994 |

* cited by examiner

Primary Examiner—Shouxiang Hu
(74) Attorney, Agent, or Firm—Maginot, Moore & Beck

(57) ABSTRACT

The invention relates to a field effect controllable semiconductor component, comprising a semiconductor body with a first terminal zone and a second terminal zone, a channel zone formed between the two terminal zones, a control electrode, and also a plurality of compensation zones. The semiconductor component furthermore has additional doping zones which are arranged in spatial proximity to the compensation zones or in a manner merged therewith. The additional doping zones are connected to the first terminal zone, if appropriate via a series diode.

12 Claims, 3 Drawing Sheets

REVERSE BLOCKING SEMICONDUCTOR COMPONENT WITH CHARGE COMPENSATION

FIELD OF INVENTION

The present invention relates to a field effect controllable semiconductor component with charge compensation. It relates in particular to a semiconductor component which is suitable for turning off upon application of a forward voltage biased in the forward or reverse direction.

BACKGROUND

Field effect controllable semiconductor components, such as vertical power MOS field effect transistors for example, are often used for switching currents or for applying voltages to loads.

Such semiconductor components are provided with a semiconductor body equipped with a first and a second doped terminal zone. A channel zone doped complementarily with respect to the doping of the terminal zones is formed between the two terminal zones. Arranged adjacent to the channel zone is a control electrode, which is electrically insulated from the semiconductor body by means of an insulating material.

In the case of a MOS field effect transistor, the first terminal zone is referred to as the source zone, the second terminal zone is referred to as the drain zone and the control electrode is referred to as the gate electrode. In practice, the MOS field effect transistor is often constructed vertically, the source zone doped with a dopant of a first conduction type being formed at a first main surface of the semiconductor body and the drain zone likewise doped with a dopant of the first conduction type being formed at a second main surface opposite to the first main surface, and the channel zone heavily doped with a dopant of the second conduction type being formed at a second main surface opposite to the first main surface, and the channel zone heavily doped with a dopant of the second conduction type being formed between said two terminal zones.

A more weakly doped drift zone of the first conduction type is usually provided between the channel zone and the drain zone, the doping of said drift zone generally being predetermined by the doping of the semiconductor body. In the case of a vertical construction of the MOS field effect transistor, the gate electrodes are usually accommodated in trenches extending from the source zone, through the channel zone, right into the drift zone.

Against the background of continually advancing miniaturization and increasing efficiency of power electronic systems, MOS field effect transistors are intended to have a lowest possible on resistance $R_{on}$, on the one hand, and a highest possible breakdown voltage, on the other hand. A reduction of the on resistance can be achieved here by increasing the doping concentration in the semiconductor body, but this measure also has the consequence of decreasing the breakdown voltage in an undesirable manner.

A reduction of the on resistance without adversely influencing the breakdown voltage is achieved in the case of MOS field effect transistors with charge compensation. In the case of such semiconductor components, so-called compensation zones are incorporated in the semiconductor body, in particular in the drift zone thereof, said compensation zones being equipped with a complementary doping with respect to the doping of the drift zone. The semiconductor body can be doped more highly on account of such compensation zones, thereby significantly reducing the on resistance of the semiconductor component. However, if a reverse voltage is applied between the two terminal zones, a space charge zone propagates in the semiconductor body and, upon reaching the compensation zones, has the effect that the charge carriers of different conduction types from the compensation zones and the drift zone are mutually compensated for, so that the number of charge carriers is reduced, and a high breakdown voltage can be realized. Charge-compensated semiconductor components of this type are sufficiently known and described for example in DE 43 097 64 C2.

Independently of the presence of compensation zones, a parasitic bipolar transistor is formed by the sequence of differently doped zones in the semiconductor component, namely the two terminal zones with charge carriers of the same conduction type and the channel zone—arranged between said terminal zones—with charge carriers of the other conduction type. In this case, the channel zone forms the base of the parasitic bipolar transistor, while the two terminal zones form the emitter and collector thereof.

It has been shown, then, that during the operation of the semiconductor component, i.e. when a forward voltage is applied between the terminal zones of the semiconductor component and a drive potential is applied to the control electrode, charge carriers of the same conduction type accumulate in the channel zone, which may activate the parasitic bipolar transistor and thereby decrease the dielectric strength of the semiconductor component in an undesirable manner. In order to avoid such a reduction of the dielectric strength of the semiconductor component due to an activation of the parasitic bipolar transistor, special precautions have to be taken, for which purpose the source zone and the channel zone are usually short-circuited in the case of a MOS field effect transistor, which has the effect that these two zones are always at the same potential, so that no charge carriers can accumulate in the channel zone and activation of the parasitic bipolar transistor is prevented.

However, short-circuiting the source and channel zones has the disadvantage that this gives rise to a diode which, if no drive potential is present at the control electrode, can turn off only in one direction. This direction is usually referred to as the "forward direction", in which case, for example with n-doped terminal zones and a p-doped channel zone, the diode turns off only when the drain electrode has a higher potential than the source electrode. If the forward voltage at the electrodes of the semiconductor component is subjected to polarity reversal, i.e. in the case of a forward voltage applied in the source-drain direction, the npn junction formed from terminal zones and channel zone with short-circuited source and channel zones conducts like a diode.

For many applications, in particular for the case where inductive loads are to be switched, it would be extremely desirable, however, to have available a field effect controllable semiconductor component which can turn off both in the forward direction and in the reverse direction if no drive potential is present at the control electrode. This prevents charge carriers from flowing into the semiconductor body in the case of a forward voltage biased in the reverse direction, said charge carriers leading to an undesirable initial voltage or current pulse in the event of a polarity reversal of the forward voltage in the forward direction.

The prior art has already specified solutions for achieving this object. Thus, EP 0 606 661 B1 proposes, for this purpose, canceling the short-circuit connection between the source zone and the channel zone and arranging instead a conductive connection to a resistor, thereby increasing the voltage drop upon application of a forward voltage in the reverse direction.

Furthermore, DE 100 60 428 A1 proposes, for this purpose, with source and channel zones not being short-circuited, the formation of a compensation zone in the channel zone and in the source zone, which has a material that promotes the recombination of charge carriers of the first and second conduction types. This prevents charge carriers from accumulating in the channel zone as a result of recombination.

U.S. Pat. No. 6,271,562 B1 describes a field effect controlled power semiconductor device having a low on resistance. In this device, source zones and base zones are connected to a source electrode via a contact hole in a known manner.

The U.S. patent application US 2001/0041400 A1 describes a method for the implementation of trench walls, in which the implantation beam assumes a slight angle with respect to the axis of the trenches.

U.S. Pat. No. 6,468,847 B1 describes a method for fabricating a high-voltage transistor, in which a body zone is not short-circuited with a source metallization.

The German patent DE 43 09 764 C2 describes a power MOSFET with compensation zones.

The published German patent application DE 102 26 664 A1 describes a semiconductor component with compensation zones, in which source and channel zones are short-circuited with one another.

The U.S. patent application US 2003/0181010 A1 describes a power semiconductor component with compensation zones, in which source and channel zones are short-circuited with one another.

SUMMARY

The present invention demonstrates alternatives that can be realized comparatively simply compared with the solutions known in the prior art for achieving the object according to the invention.

A first subject matter of the invention specifies a field effect controllable semiconductor component with charge compensation, which is equipped in a conventional manner with a semiconductor body with a first terminal zone of a first conduction type, which comprises a first electrode, and a second terminal zone of the first conduction type, which comprises a second electrode. A channel zone of a second conduction type is formed between the two terminal zones, said channel zone being arranged in a manner electrically insulated from the first electrode. A control electrode is arranged adjacent to the channel zone and in a manner electrically insulated from the semiconductor body. For the purpose of charge compensation, a plurality of compensation zones of the second conduction type are arranged in the region between the two terminal zones with a respective spacing between adjoining compensation zones. The semiconductor component according to the invention is essentially distinguished by the fact that additional doping zones of the second conduction type are arranged in spatial proximity to the compensation zones of the second conduction type. These additional doping zones are electrically conductively connected to the first terminal zone via a series-connected series diode (for example conventional pn diode) that is conductive in the direction toward the first terminal zone. In the case of a conventional pn diode and additional doping zones of the p type, the anode (i.e. n-doped region) of the pn diode is accordingly electrically conductively connected to the additional doping zones, whereas in the case of additional doping zones of the n type, the cathode (i.e. n-doped region) of the pn diode is electrically conductively connected to the additional doping zones. The electrically conductive connection of the additional doping zones to the first terminal zone, with interposition of the series diode, may be effected in particular by means of an additional electrical connecting line.

The additional doping zones (or the geometrical centroids of the additional doping zones) may in this case be arranged in a two-or three-dimensional lattice.

In the semiconductor component according to the invention, the first terminal zone is not short-circuited with the channel zone (first electrode does not make contact with channel zone), rather the channel zone is formed in floating fashion, which has the consequence that the semiconductor component according to the invention can turn off upon application of a forward voltage biased both in the forward direction and in the reverse direction. In particular, the body zone and the channel zone are thus not short-circuited in the case of a MOS field effect transistor. In order to simplify the description, it shall be assumed here, following customary practice, that a forward voltage at the electrodes which is biased in the "forward direction" is intended to mean that direction which corresponds to the blocking direction of a diode—formed with the source zone and channel zone short-circuited—of the sequence of differently doped zones, while the "reverse direction" corresponds to a corresponding polarity reversal of the forward voltage.

An activation of the parasitic bipolar transistor is prevented in the semiconductor component according to the invention by virtue of the charge carriers that would accumulate in the channel zone or in the base of the parasitic bipolar transistor during operation of the semiconductor component being intercepted by the additional doping zones. The additional doping zones act as a JFET gate in this case. The condition prescribed according to the invention, according to which the additional doping zones have to be arranged in spatial proximity to the compensation zones, is fulfilled when the additional doping zones are electrically coupled to the compensation zones, so that a JFET gate can be realized.

Since the invention avoids a multiplication of the reverse current as a result of charge carriers flowing into the base of the parasitic bipolar transistor, the original breakdown voltage of the parasitic bipolar transistor can advantageously be maintained. This presupposes that the additional doping zones are dimensioned in such a way that the parasitic bipolar transistor contains merely a collector voltage that is so low that the collector-emitter breakdown voltage $U_{CE0}$ of the parasitic bipolar transistor is not reached. To put it another way, what can be achieved as a result of the electrical connection of the additional doping zones to the first terminal zone or the first electrode is that a significant portion of the forward voltage applied to the two terminal zones is dropped between the additional doping zones and the second terminal zone. What is crucial in this case is that the collector voltage of the parasitic bipolar transistor remains below the collector-emitter breakdown voltage $U_{CE0}$.

Since the additional doping zones in the semiconductor body give rise to a diode which conducts in the case of forward voltage biased in the reverse direction, care must be taken to ensure that an undesirable injection of charge carriers of identical charge type into the additional doping zones is prevented. This is achieved by the positioning of an additional series-connected series diode in the electrically conductive connection between the additional doping zones and the first terminal zone. If the additional doping zones are doped with p-type charge carriers, for example, then an injection of positive charge carriers into the additional doping zones is prevented by the series diode in the case of a forward voltage biased in the reverse direction. In this case, the series diode is to be constructed such that no parasitic bipolar transistor with a reduced breakdown voltage arises. The series diode is preferably designed in such a way that it is suitable for turning off only up to a predetermined breakdown voltage, said breakdown voltage being at most 20 V. According to the invention, it is even more preferred for the series diode to have a breakdown voltage of at most 10 V.

In accordance with a second subject matter of the present invention, a field effect controllable semiconductor component has, in a known manner, a semiconductor body with a first terminal zone of a first conduction type, which comprises a first electrode, and a second terminal zone of the first conduction type, which comprises a second electrode. A channel zone of a second conduction type is formed between the two terminal zones, said channel zone being arranged in a manner electrically insulated from the first electrode, i.e. the first electrode does not make contact with the channel zone. The channel zone is thus formed in floating fashion, which has the consequence that the semiconductor component according to the invention can turn off upon application of a forward voltage biased both in the forward direction and in the reverse direction. In particular, the body zone and the channel zone are thus not short-circuited in the case of a MOS field effect transistor. A control electrode is formed adjacent to the channel zone and in a manner electrically insulated from the semiconductor body. Moreover, the semiconductor component has a plurality of compensation zones of the second conduction type, which are arranged in the region between the two terminal zones with a respective spacing between adjoining compensation zones. According to the invention, the semiconductor component is distinguished by the fact that additional doping zones of the second conduction type, which are electrically conductively connected to the first electrode, in particular via an additional electrical connecting line, are arranged in spatial proximity to the compensation zones of the second conduction type, adjoining additional doping zones overlapping one another essentially in area-covering fashion. The additional doping zones (or the geometrical centroids of the additional doping zones) may in this case be arranged in a two- or three-dimensional lattice, the edges of the additional doping zones overlapping one another essentially in area-covering fashion.

In the semiconductor component in accordance with the second subject matter of the present invention, it is possible to dispense with an additional series diode in the electrical connecting line between the additional doping zones and the first terminal zone because the additional doping zones that overlap one another essentially in area-covering fashion themselves act as a diode and are thus suitable for undertaking the function of the series diode. The additional doping zones that overlap one another essentially in area-covering fashion overlap in such a way that they form an essentially contiguous area between the two terminal zones. (In this case, the geometrical centroids of the additional doping zones may be arranged in a two- or three-dimensional lattice).

In one advantageous refinement of the semiconductor component according to the invention, the additional doping zones are arranged on that side of the compensation zones which faces the first electrode.

According to the invention, the additional doping zones are arranged in spatial proximity to the compensation zones, in such a way that a JFET gate can be realized. In this case, an additional doping zone preferably has a spacing from a compensation zone which corresponds at most to the spacing between the compensation zones. A typical intervening spacing of mutually adjoining compensation zones, expressed in absolute values, lies in the region of a few micrometers, and amounts to 2 to 3 µm, for example.

The additional doping zones may also be arranged without any spacing with respect to the compensation zones, in such a way that an additional doping zone and a compensation zone merge with one another and form a contiguous region. In this case, it is preferred for an additional doping zone to be arranged within a half of a compensation zone that faces the first electrode. A particularly preferred arrangement of the additional doping zones provides for the additional doping zones to be arranged at an end of the compensation zones that faces the first electrode, so that the voltage drop of a forward voltage applied to the electrodes along the parasitic bipolar transistor is as low as possible and the voltage drop between the doping zones and the second terminal zone is as large as possible.

According to the invention, it is preferred for the additional doping zones (or the geometrical centroids thereof) to form a two- or three-dimensional lattice. Such a two- or three-dimensional lattice may have square or respectively cubic lattice elements, for example.

The additional doping zones may have an essentially spherical form which may be formed for instance as a result of an outdiffusion of doping atoms during a diffusion process. The midpoint of the spherical additional doping zones in this case corresponds to the geometrical centroid thereof.

In the semiconductor component according to the invention, the number of additional dopings advantageously corresponds to the number of compensation zones, so that an additional doping zone is in each case situated in spatial proximity to a respective compensation zone, or, as an alternative, an additional doping zone in each case merges with a respective compensation zone and forms a contiguous region.

According to the invention, it is preferred for the number of charge carriers of the second conduction type in the compensation zones to be chosen in such a way that an essentially complete depletion of the compensation zones takes place when a reverse voltage is applied to the electrodes. In this case, the semiconductor component according to the invention is equipped for example such that the number of charge carriers of the second conduction type in the compensation zones essentially corresponds to the number of charge carriers of the first conduction type in the regions of the semiconductor body which surround the compensation zones.

It is furthermore preferred for the number of charge carriers of the second conduction type in the additional doping zones to be greater than the number of charge carriers of the second conduction type in the compensation zones, so that, in contrast to the compensation zones, the additional doping zones are not completely depleted when a reverse voltage is applied to the two electrodes. This results in a low electrical resistance of the additional doping zones which is advantageous for fulfilling the function according to the invention.

In a further advantageous refinement of the invention, the semiconductor component is provided with a trench structure. The semiconductor component in this case has a semiconductor body with a first main surface and a second main surface opposite to the first main surface, the first terminal zone being formed at the first main surface and the second terminal zone being formed at the second main surface. Furthermore, a plurality of trenches are provided at the first main surface, each trench receiving a control electrode, an additional doping zone that is electrically insulated from the control electrode, and also a compensation zone. The compensation zones are in this case formed in pillar-type fashion, for example.

The semiconductor components according to the invention can be fabricated using conventional fabrication methods. By way of example, the terminal zones are fabricated epitaxially, while the compensation zones and the additional doping zones are fabricated by means of the known trench technique. The compensation zones and the additional doping zones may in this case be fabricated by progressive trench etchings and subsequent respective filling with the desired doping material, or by a single trench etching with progressive filling with the desired doping materials. In the latter case, the production of the semiconductor component according to the invention proves to be particularly simple since only a single trench etching has to be performed for jointly forming compensation zones and the additional doping zones.

BRIEF DESCRIPTION OF THE DRAWING

The invention will now be explained in more detail on the basis of exemplary embodiments, reference being made to the accompanying drawings, in which.

DETAILED DESCRIPTION

Figure 1:
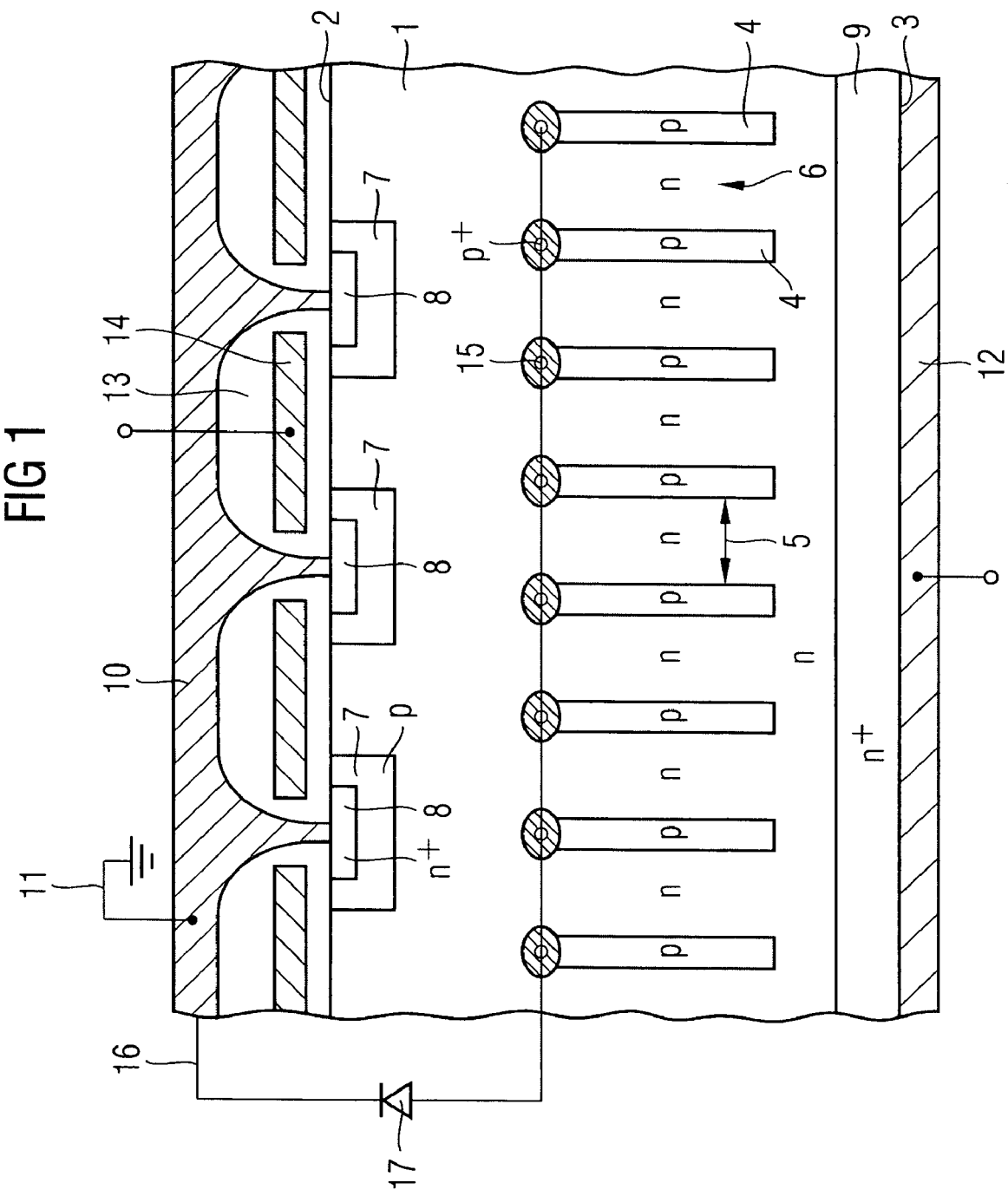
FIG. 1 shows a schematic sectional view through an embodiment according to the invention of a semiconductor component in accordance with the first subject matter of the invention.

In the following exemplary embodiments, the charge carriers of the first conduction type correspond to n-type charge carriers, while the charge carriers of the second conduction type correspond to p-type charge carriers. In the figures, identical elements or elements of identical type are designated by the same reference numerals.

FIG. 1 shows a schematic sectional illustration of a semiconductor component according to the invention in accordance with the first subject matter of the invention. A semiconductor body 1 made of silicon has an n-doped drift zone between a first main surface 2 and a second main surface 3 opposite thereto. p-doped compensation zones 4 in the form of longitudinal pillars are incorporated into the n-doped drift zone, and in each case have an intervening spacing 5 from one another. The compensation zones 4 are in each case arranged in such a way that the p-doped compensation zones 4 are interleaved with n-doped regions 6 of the semiconductor body 1 that are arranged in between.

In this case, the number of p-doped charge carriers in the compensation zones 4 is chosen such that the compensation zones 4 and the n-doped regions 6 of the semiconductor body 1 that lie in between are essentially depleted when a reverse voltage is applied to the semiconductor component. In this case, the n-doped regions 6 of the semiconductor body 1 may have a doping corresponding to the basic doping of the semiconductor body 1, or may also be doped more highly than said basic doping. FIG. 1 illustrates the compensation zones in one layer or stratum, in which case they form a two-dimensional lattice. However, they may also be arranged in lattice form in a plurality of strata and in this way form a three-dimensional lattice. p-doped body zones 7 are formed in a manner adjoining the first main surface 2 of the semiconductor body 2, and in each case contain $n^+$-doped source zones 8 that likewise adjoin the first main surface 2. An $n^+$-doped drain zone 9 is formed in a manner adjoining the second main surface 3 of the semiconductor body 1.

In the semiconductor component according to the invention as shown in FIG. 1, a source electrode 10 made of aluminum, for example, is connected to the source zones 8, said source electrode being grounded by means of the grounding 11. A drain electrode 12 made of aluminum, for example, is connected to the drain zone 9. A potential +U may be present at the drain electrode 12 in the case of a forward-directed forward voltage (voltage in the drain-source direction) or a potential –U may be present at said drain electrode in the case of a reverse-directed forward voltage (voltage in the source-drain direction).

Insulation layer zones 13 made of silicon dioxide, for example, are situated on the first main surface 2, gate electrodes 14 made, for example, of polycrystalline silicon and/or metal being embedded in said insulation layer zones. The gate electrodes 14 are arranged adjacent to the body zones 7. A control voltage for forming an n-conducting channel in the body zone 7 may be applied to the gate electrodes 14.

According to the invention, the semiconductor body 1 shown in FIG. 1 has $p^+$-doped additional doping zones 15 having an essentially spherical form. The additional doping zones 15 in each case merge with that end of the compensation zones 4 which faces the source electrode 10 to form a contiguous region. In this case, the number of additional doping zones 15 corresponds to the number of compensation zones 4. The additional doping zones 15 are embodied in the form of a two-dimensional lattice, analogously to the compensation zones 4. In this case, the two-dimensional lattice is like a lattice with square lattice cells. FIG. 1 illustrates the additional doping zones 15 in one layer or stratum, but they may also be arranged in a plurality of strata in the form of a three-dimensional lattice.

Whereas the compensation zones 4 are doped in such a way that charge carriers of the compensation zones 4 and of the n-doped regions 6 of the semiconductor body 1 that adjoin the latter are essentially depleted when a reverse voltage is applied to the two electrodes of the semiconductor body, the additional doping zones 15 are doped with a higher number of p-type charge carriers in comparison with the compensation zones 4, so that the additional doping zones 15 are not completely depleted when a reverse voltage is applied to the electrodes of the semiconductor component.

The additional doping zones 15 are furthermore electrically connected to the source electrode 10 with the aid of the electrical connecting line 16. A series-connected series diode 17 is situated in the electrical connecting line 16 and prevents p-type charge carriers from being injected into the additional doping zones 15 upon application of a forward voltage biased in the reverse direction. The series diode 17 is constructed for example using polysilicon and has a breakdown voltage of 10 V.

The n⁺-doped source zone 8, the p-doped body zone 7 and the n-doped drain zone of the semiconductor body 1 form a parasitic bipolar transistor. An activation of the parasitic bipolar transistor is prevented by p-type charge carriers being intercepted by the additional doping zones 15, which in this case act as a JFET gate.

Figure 2:
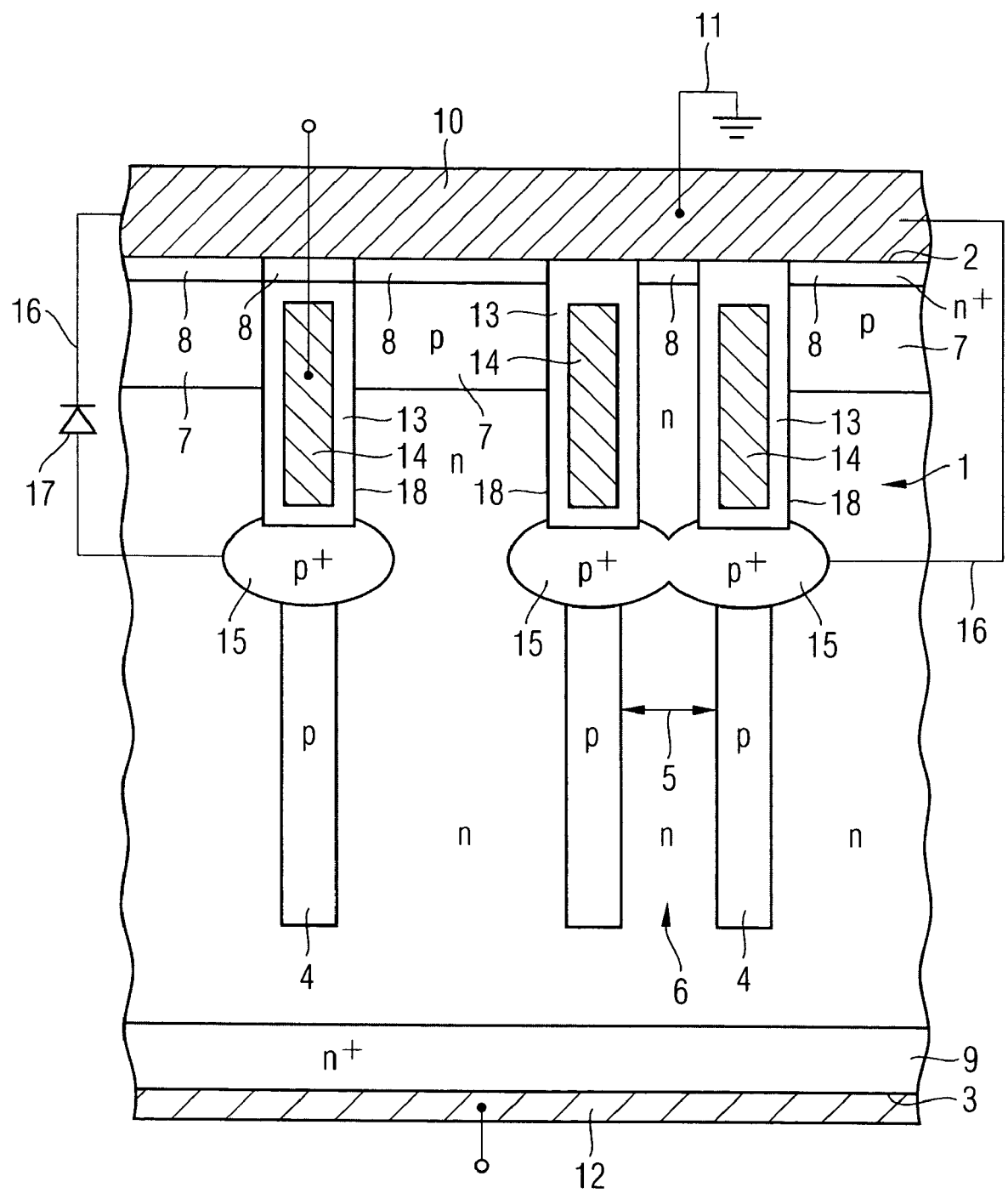
FIG. 2 shows a schematic sectional view through a semiconductor component showing, in a section, an embodiment in accordance with the first subject matter of the invention and an embodiment in accordance with the second subject matter of the invention.

FIG. 2 shows a schematic sectional illustration through a semiconductor component according to the invention with a trench structure. FIG. 2 shows an exemplary embodiment in accordance with the first subject matter of the invention and an exemplary embodiment in accordance with the second subject matter of the invention in a sectional illustration. The control electrode is formed as a "trench gate" in both exemplary embodiments. In terms of its sequence of doped regions, the semiconductor component of FIG. 2 is like the semiconductor component of FIG. 1, so that, in order to avoid unnecessary repetition, only the essential differences between the semiconductor components shown in FIG. 1 and FIG. 2 will be described.

In the semiconductor component with trench structure as shown in FIG. 2, trenches 18 are formed in the semiconductor body 1. Said trenches 18 in each case receive a compensation zone 4, an additional doping zone 15 and a gate electrode 14 with a surrounding insulating material 13 made of silicon dioxide, for example. Such a construction has the advantage in terms of production technology that the compensation zones 4 and additional doping zones 15 can be fabricated by means of just a single trench etching and subsequent filling with the desired doping materials. In this case, the additional doping zones 15 are merged with the compensation zones 4 at that end of the latter which faces the source electrode 10, or form a contiguous region with said compensation zones.

The source zones 8 are formed at the first main surface 2 of the semiconductor body 1, while the body zones 7 are formed in a manner adjoining the source zones 8. The trenches 18 extend from the first main surface 2 of the semiconductor body 1 through the source zones 8 and the body zones 7 right into the n-doped drift zone of the semiconductor body 1. The p-doped compensation zones are doped in such a way that the charge carriers in the compensation zones 4 and the adjoining n-doped regions 6 of the semiconductor body 1 are essentially depleted when a reverse voltage is applied to the semiconductor component, while the additional doping zones 15 are doped more heavily by comparison, so that charge carriers of the additional doping zones 15 are not depleted when a reverse voltage is applied to the semiconductor component.

The trench 18 illustrated on the left in FIG. 2 corresponds to an exemplary embodiment in accordance with the first subject matter of the semiconductor component according to the invention. The additional doping zone 15 contained in the trench 18 illustrated on the left in FIG. 2 is part of a lattice-type formation of additional doping zones 15 which are connected to the source electrode 10 via the electrical connection 16 and a series-connected series diode 17.

The trenches 18 illustrated in the middle and on the right in FIG. 2 correspond to an exemplary embodiment in accordance with the second subject matter of the present invention. In the case of this embodiment, the additional doping zones 15 merge with one another essentially in area-covering fashion. This has the effect that the additional doping zones 15 act as a diode which can undertake the function of the series diode 17 in the electrical connecting line 16. Accordingly, the connecting line 16 of the additional doping zones 15 to the source electrode 10 in the embodiment in accordance with the second subject matter of the present invention as shown in FIG. 2 has no series diode.

In the exemplary embodiments shown in FIGS. 1 and 2, the specified conductivity types (n and p) may also be reversed in each case. Source and drain zones may thus be p⁺-conducting if the drift zone is p-conducting and the body zone is n-conducting. In this case, the compensation zones are n-conducting and the additional doping zones are n⁺-conducting.

Figure 3:
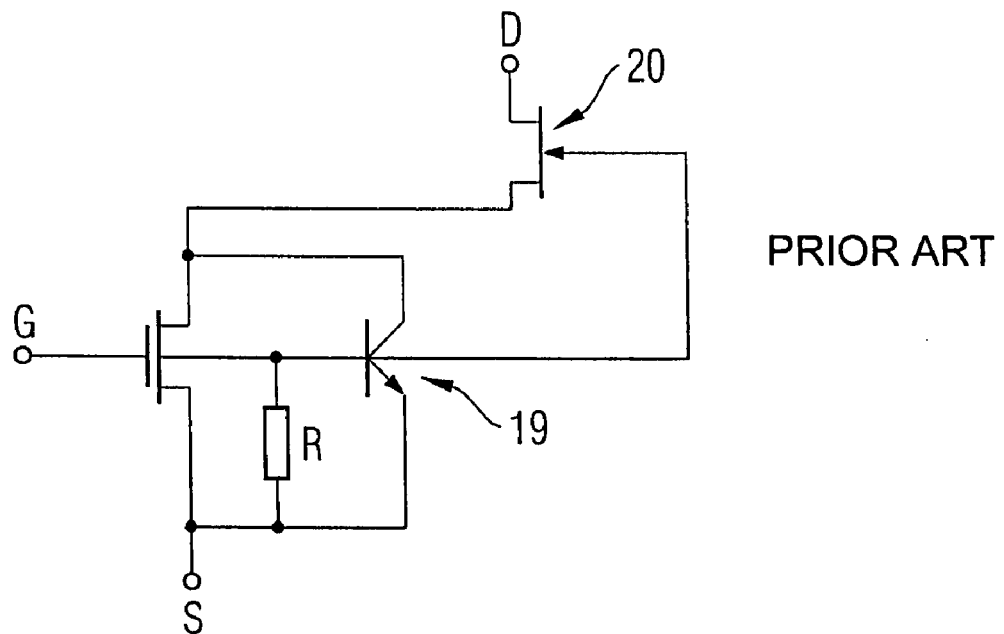
FIG. 3 shows an equivalent circuit diagram of a conventional MOS field effect transistor with charge compensation.

FIG. 3 shows an equivalent circuit diagram of a conventional MOS field effect transistor with charge compensation. It reveals the MOS field effect transistor with source electrode (S), drain electrode (D) and gate electrode (G), the source electrode (S) and the gate electrode (G) being short-circuited via a short-circuiting resistor (R) having a lowest possible resistance. The parasitic bipolar transistor (19) resulting from the sequence of differently doped regions is furthermore depicted. The compensation zones in the drift zone of the semiconductor body of the MOS field effect transistor form a JFET gate (20) which is electrically conductively connected to the base of the parasitic bipolar transistor (19).

Figure 4:
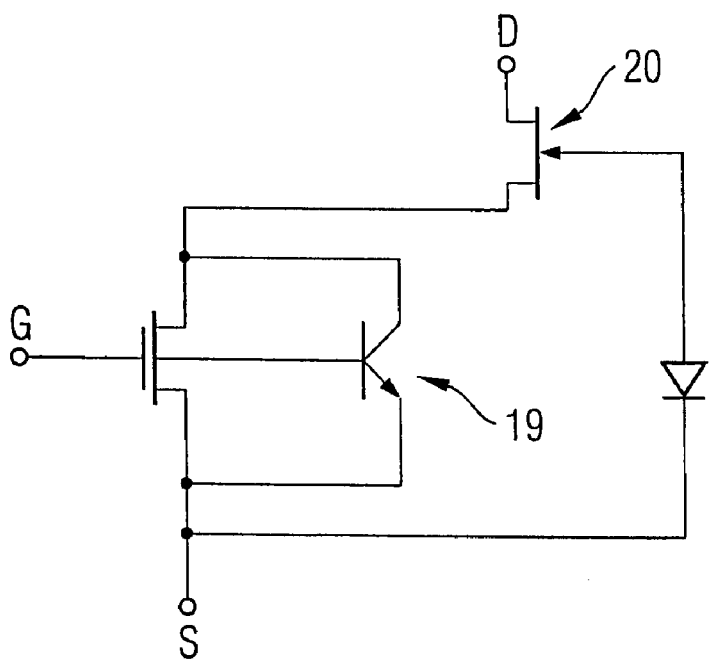
FIG. 4 shows an equivalent circuit diagram of a MOS field effect transistor with charge compensation in accordance with the present invention.

FIG. 4 shows an equivalent circuit diagram of a MOS field effect transistor with charge compensation in accordance with the present invention. It reveals the MOS field effect transistor (19) with the source electrode (S), the drain electrode (D) and the gate electrode (G), the source electrode (S) and the gate electrode (G) not being short-circuited, in contrast to the equivalent circuit diagram shown in FIG. 3 with regard to a conventional MOS field effect transistor. The parasitic bipolar transistor (19), provided with a floating base, is furthermore depicted. The compensation zones in the drift zone of the semiconductor body of the MOS field effect transistor form a JFET gate (20) which is electrically connected to the source electrode (S). A series diode is connected in the connecting line between JFET gate (20) and the source electrode (S). In a semiconductor component in accordance with the first subject matter of the present invention, this diode function is fulfilled by an additional series diode, whereas in the semiconductor component in accordance with the second subject matter of the present invention, this diode function is realized by the additional doping zones that overlap one another essentially in area-covering fashion.

The invention is not restricted to the embodiments shown. Thus, the semiconductor component according to the invention may in principle have a vertical or lateral structure. All that is essential for the arrangement of the compensation zones is a staggered or nested arrangement of successive zones of identical and complimentary conduction types.

The invention claimed is:

1. A field effect controllable semiconductor component, comprising:
   a semiconductor body having a first terminal zone of a first conduction type, which is connected to a first electrode, and a second terminal zone of the first conduction type which is connected to a second electrode,
   a channel zone of a second conduction type disposed between the first and second terminal zones and floating with respect to the first electrode;
   a control electrode arranged adjacent to the channel zone, the control electrode electrically insulated from the semiconductor body, a plurality of compensation zones of the second conduction type arranged in a region between the first terminal zone and the second terminal zone, in said semiconductor body and spaced apart from said channel zone, the plurality of compensation zones being spaced apart from each other by intervening spacings between the compensation zones, respectively, additional doping zones of the second conduction type, each arranged in spatial proximity to a corresponding one of the plurality of compensation zones, and an electrical connecting line connecting the additional doping zones to the first terminal zone via a series-connected diode directed with its forward direction toward the first terminal zone.

2. The semiconductor component according to claim 1, wherein the diode has a breakdown voltage of at most 20 V.

3. The semiconductor component according to claim 2, wherein the diode has a breakdown voltage of at most 10 V.

4. The semiconductor component according to claim 1, wherein a first one of said additional doping zones and a corresponding first one of said compensation zones form a first contiguous region.

5. The semiconductor component according to claim 1, wherein the additional doping zones are arranged in lattice-type configuration.

6. The semiconductor component according to claim 1, wherein the additional doping zones have a doping concentration that is higher than the doping concentration of said compensation zones.

7. A semiconductor component, comprising:

a semiconductor body having a first terminal zone of a first conduction type which is connected to a first electrode, and a second terminal zone of the first conduction type, which is connected to a second electrode, a channel zone of a second conduction type disposed between the first and second terminal zones and spaced apart from the first electrode;

a control electrode arranged adjacent to the channel zone, the control electrode electrically insulated from the semiconductor body, and a plurality of compensation zones of the second conduction type arranged in a region between the first electrode and the second electrode in said semiconductor body and spaced from said channel zone, the plurality of compensation zones being spaced apart from each other by intervening spaces between adjacent compensation zones, and additional doping zones of the second conduction type, each arranged in spatial proximity to a corresponding one of the plurality of compensation zones, the additional doping zones being connected to the first electrode via a diode biased with its forward direction toward the first terminal zone.

8. The semiconductor component according to claim 7, wherein the additional doping zones are arranged on a side of the corresponding compensation zones that is nearer the first electrode than an opposite side of the corresponding first compensation zones.

9. The semiconductor component according to claim 7, wherein a first one of said additional doping zones has a spacing from a corresponding first one of said compensation zones that is at most equivalent in its length to the intervening spacing between the first one of said compensation zones and an adjacent compensation zone.

10. The semiconductor component according to claim 7, wherein a first one of said additional doping zones and a corresponding first one of said compensation zones form a first contiguous region.

11. The semiconductor component according to claim 10, wherein the first additional zone is arranged within a half of the first compensation zone that is nearer the first electrode than an opposite half of the first compensation zone.

12. The semiconductor component according to claim 7, wherein the additional doping zones have a doping concentration that is higher than the doping concentration of said compensation zones.

* * * * *